United States Patent [19]

Katagiri et al.

[11] 4,189,641
[45] Feb. 19, 1980

[54] ELECTRON MICROSCOPE

[75] Inventors: Shinjiro Katagiri, Mito; Minoru Shinohara; Shoji Kamimura, both of Katsuta, all of Japan

[73] Assignee: Hitachi, Ltd., Japan

[21] Appl. No.: 829,916

[22] Filed: Sep. 1, 1977

[30] Foreign Application Priority Data

Sep. 3, 1976 [JP] Japan .............................. 51-104864

[51] Int. Cl.² .......................................... G01M 23/00
[52] U.S. Cl. .................... 250/311; 250/306; 250/492 R
[58] Field of Search ............... 250/311, 492 R, 492 A, 250/492 B

[56] References Cited
U.S. PATENT DOCUMENTS

| | | | |
|---|---|---|---|
| 3,137,791 | 6/1964 | Gutter | 250/311 |
| 3,221,133 | 11/1965 | Kazato et al. | 250/311 |
| 3,283,120 | 11/1966 | Spruck | 250/311 |
| 3,547,074 | 12/1970 | Hirschfeld | 250/492 A |
| 3,711,711 | 1/1973 | Dao et al. | 250/311 |
| 3,737,617 | 6/1973 | Llop et al. | 250/311 |
| 3,757,120 | 9/1973 | Muller et al. | 250/311 |
| 3,838,313 | 9/1974 | Anderson | 250/492 R |
| 4,045,669 | 8/1977 | Kamimura et al. | 250/311 |

*Primary Examiner*—Harold A. Dixon
*Attorney, Agent, or Firm*—Craig and Antonelli

[57] ABSTRACT

An electron beam emitted from an electron beam source is applied to a sample and when it produces an magnified image of the sample on a fluorescent plate, the amount of the electron beam is detected. When the accumulation of the electron beam radiation reaches a predetermined value with lapse of the time, the beam density on the surface of the sample is so controlled as to be reduced to zero or below a certain preset level, whereby the sample is prevented from damage due to excessive exposure to the electron beam.

5 Claims, 5 Drawing Figures

ELECTRON MICROSCOPE

BACKGROUND OF THE INVENTION

1. Field of the Invention

This invention relates to an electron microscope wherein the density of electron beam projected on a sample of material being examined can be detected and also controlled.

2. Description of the Prior Art

In an electron microscope, a beam of electrons is projected onto a sample to be examined and a magnified image of the sample is produced by use of the electrons scattered by or transmitted through the sample, so that the irradiation of the sample by the electron beam is essential for examination.

However, the irradiation of the sample by the electron beam causes two inherent problems: contamination in the sample and damage of the sample. Many researches have been reported on the contamination in samples and successful measures have been found to prevent such contaminations. For example, one of the measures is to cool the sample chamber.

On the other hand, there have been few countermeasures against the damage of the sample. The sample damage can be classified roughly into two sorts: the damage due to the irradiation of the sample by an electron beam of excessively high density and that derived from an excessive amount of electric charges accumulated due to long time irradiation. Both the damages tend to change the inherent property of the sample and therefore in order to make a precise examination of the sample, it is necessary to measure and control the density of the electron beam applied to the sample during examination.

The measurements of the electron beam density are often done in the field of electron microscopes when microscopic images are to be photographed. That is, the density of the electron beam has a certain relation to the brightness in photographing and the beam density as one of conditions in photographing is measured. As a result of developing such a measurement, there has been proposed a method wherein in order to enable photographing under a constant brightness independent of the magnifying power of electron microscope the measured density of the electron beam is compared with a signal representing a desired brightness, and the lens system of the electron microscope is controlled in accordance with the result of the comparison. Such a method is disclosed in, for example, U.S. patent application Ser. No. 712,664 (Mar. 25, 1977).

The above described method is indeed intended to automatically control brightness of the images in photographing, but not to be used as a measure for preventing damage of the sample.

SUMMARY OF THE INVENTION

One object of this invention is to provide an electron microscope capable of obtaining exact information from microscopic observation of a sample by preventing damage of the sample due to excessive radiation of the electron beam.

Another object of this invention is to provide an electron microscope capable of automatically preventing damage of the sample due to excessive radiation of the electron beam.

Yet another object of this invention is to provide an electron microscope having a high reliability.

According to this invention which has been made to attain the above objects, an electron microscope is arranged such that when a beam of electrons emitted from an electron beam source is projected onto a sample of material to be examined, the density of the electron beam is detected, and when the accumulation of the electron beam radiation reaches a predetermined value during the examination, the beam density on the surface of the sample is controlled to be reduced to zero or below a predetermined level.

DESCRIPTION OF THE PREFERRED EMBODIMENT

Figure 1:
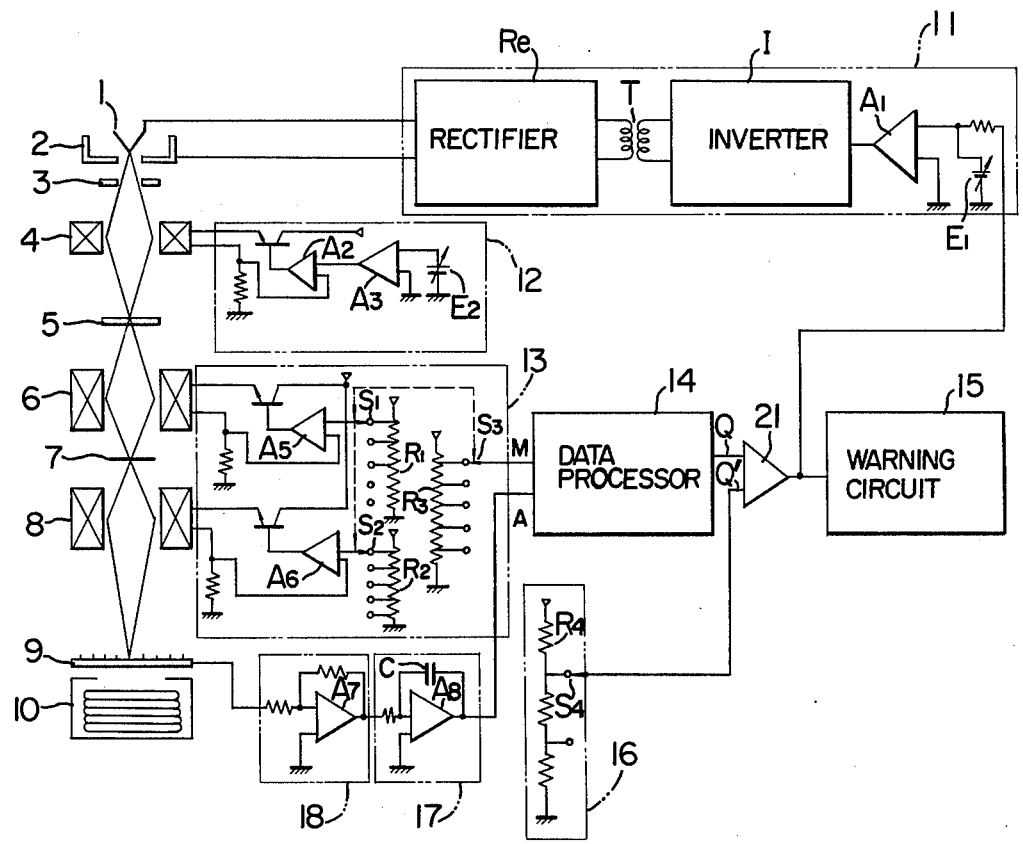
FIG. 1 schematically shows an electron microscope as an embodiment of this invention.

Reference should first be made to FIG. 1 showing an electron microscope as an embodiment of this invention. A beam of electrons emitted from a filament 1 is controlled by a Wehnelt cylinder 2, accelerated by an anode 3, and focussed by a condenser lens 4 to irradiate a sample 5. The electron beam having transmitted through the sample 5 is magnified by an objective 6 to produce an electron image 7 of the sample. This image 7 is further magnified by a projection lens 8 to form a visual image on a fluorescent plate 9. A camera box 10 has photographic films therein and if the fluorescent plate 9 is removed, the final image is photographed on the film.

According to the embodiment of this invention, the fluorescent plate 9 is electrically insulated from the ground potential. Namely, the fluorescent plate 9 serves as a Faraday cage and if a slight correction is made for reflected electrons, the electron beam density can be precisely measured. If it is assumed in this case that the electron beam always irradiates a constant area of the fluorescent plate 9, then the plate 9 can derive an electric signal proportional to the density of the electron beam i.e. the amount of electrons projected on a unit area of the plate during a unit time interval. This electric signal is amplified by an amplifier 18 including an operational amplifier $A_7$ and the output of the amplifier 18 is applied to an integrator 17 including an operational amplifier $A_8$ and a capacitor C. The output of the integrator 17, the result of integration, is sent to one of the two inputs of a data processor 14.

For example, a digital operating device such as a microcomputer, having an A/D and a D/A converter respectively at the input and output sides may be used as the data processor 14. A magnifying power control circuit 13 is provided to control the magnifying power of the electron microscope by controlling the exciting currents for the objective 6 and the projection lens 8 in accordance with the output signals from two operational amplifiers $A_5$ and $A_6$, respectively. A desired magnifying power is set by manipulating the ganged switches $S_1$ and $S_2$ interlinked with each other and associated respectively with voltage dividing resistors $R_1$ and $R_2$. The signals corresponding to the set positions of the respective switches are applied to the operational amplifiers $A_5$ and $A_6$ thereby adjusting the exciting currents for the lens systems to achieve the desired magnifying power. The magnifying power control circuit includes another voltage dividing resistor $R_3$ and a switch $S_3$ which is interlinked with the switches $S_1$ and $S_3$, for producing a signal corresponding to the set value of the magnifying power, which signal is applied to the data processor 14.

Now, let the magnifying power of the final image on the fluorescent plate 9 be denoted by M, the electron beam density by A, and the time interval for which the sample is irradiated by the electron beam by T. Then, the accumulation Q of electron beam radiation, which is corresponding to the total electrons transmitted through the sample during the time interval, is given by the following formula $$Q = kAM^2T \quad (1),$$

where k is a constant.

The data processor 14 calculates the quantity of $AM^2T$ by receiving the magnifying power setting signal M and the beam density A and then delivers an output signal proportional to the accumulation Q of electron beam radiation.

An accumulation setting circuit 16 is provided to include a voltage dividing resistor $R_4$ and a switch $S_4$. The switch $S_4$ is previously set at a position where an output voltage Q' corresponding to the maximum accumulation of electron beam radiation applicable to a sample without inviting any substantial damage thereof is derived from the resistor $R_4$. The signal Q' is compared with the signal Q corresponding to the actual accumulation of electron beam radiation by a comparison circuit 21.

The comparison circuit 21 is so designed to deliver an output having, for example, a high level when the signal Q corresponding to the actual accumulated radiation Q, varying with the irradiation time T, becomes equal to the signal Q' corresponding to the set value for accumulated radiation. Accordingly, if a warning circuit 15 is driven by the high level signal, the warning circuit 15 can produce a signal representing the allowable upper limit of irradiation of the sample by the electron beam.

Moreover, according to this invention, not only the above limit of irradiation is given, but also the electron beam is forcibly and automatically deflected or attenuated so that the quantity of the electrons hitting the sample may be decreased.

Namely, an electron gun control circuit 11 shown in FIG. 1 includes an operational amplifier $A_1$, a power source $E_1$, an inverter I, a transformer T and a rectifier Re so that the D.C. power of the source $E_1$ is applied by the amplifier $A_1$ and then converted to an A.C. power which in turn is applied through the transformer P to the rectifier so as to be again converted to a D.C. power having a D.C. voltage corresponding to the voltage of the D.C. source $E_1$. The D.C. power of the rectifier is applied to the filament 1 and the cathode 2. A condenser lens control circuit 12 includes two operational amplifiers $A_2$ and $A_3$ and a power source $E_2$. The voltage of the source $E_2$ is so determined as to make the electron beam projected upon the sample 5 to form a tiny spot on the surface of the sample.

With this construction, as shown in FIG. 1, the output of the comparison circuit 21 is supplied to the operational amplifier $A_1$ of the electron gun control circuit 11 so as to cancel or reduce the effect of the voltage of the power source $E_1$ so that the output of the electron gun control circuit 11 serves to cause the electrons emitted from the filament 1 to decrease to zero or less than a predetermined level when the output of the comparator 21 exists. The decrease in amount of the electrons in the beam is effective to reduce the damage of the sample. Of course, the cease of the emission of the electrons will assure the complete prevention of damage of the sample due to irradiation.

Figure 2:
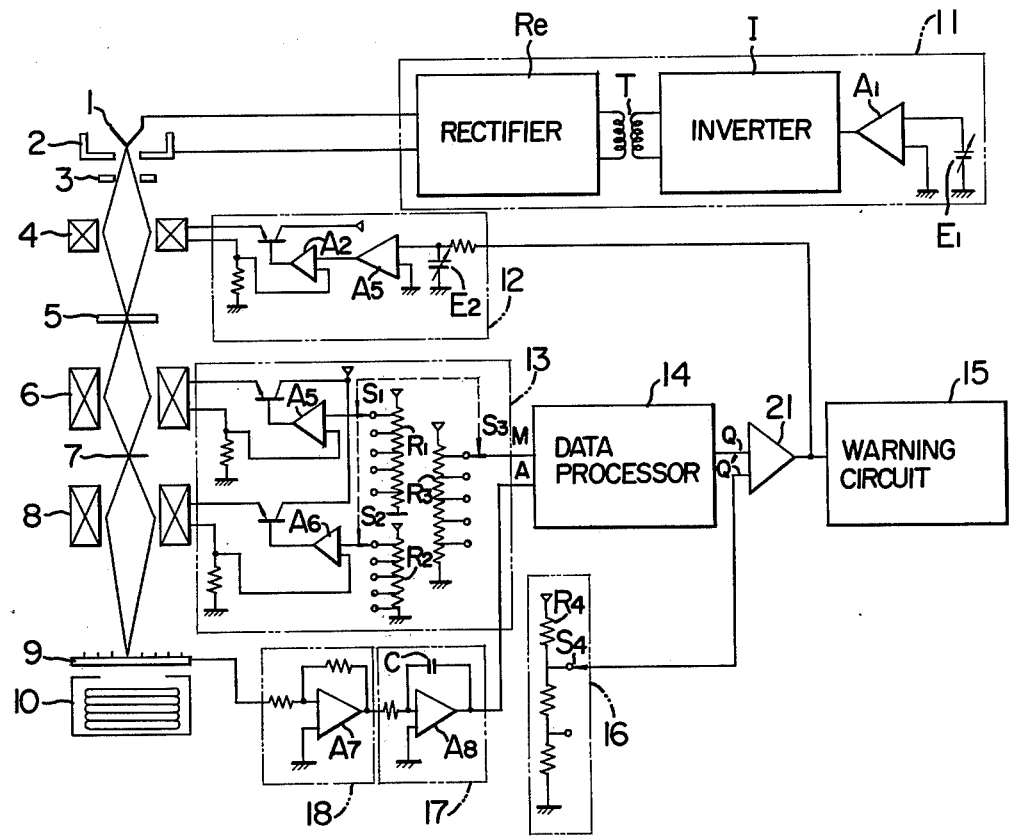
FIG. 2 schematically shows another embodiment of the electron microscope of the present invention.

FIG. 2 shows another embodiment of this invention. In this embodiment, the output of the comparator 21 is supplied to the condenser lens control circuit 12 so as to prevent the damage of the sample by decreasing the density of the electron beam hitting the sample 5, in contrast to the previous embodiment shown in FIG. 1 in which the output signal of the comparator 21 is supplied to the electron gun control circuit 11 to cause the electrons emitted from the filament 1 to decrease or cease. Namely, the electron beam normally forms a tiny spot on the sample 5, but when the output signal of the comparator 21 is added to the voltage of the power source $E_2$, the exciting current for the condenser lens 4 is so changed as to increase the area of the spot of the electron beam on the sample and therefore to decrease the density of the electron beam on the sample.

Figure 3:
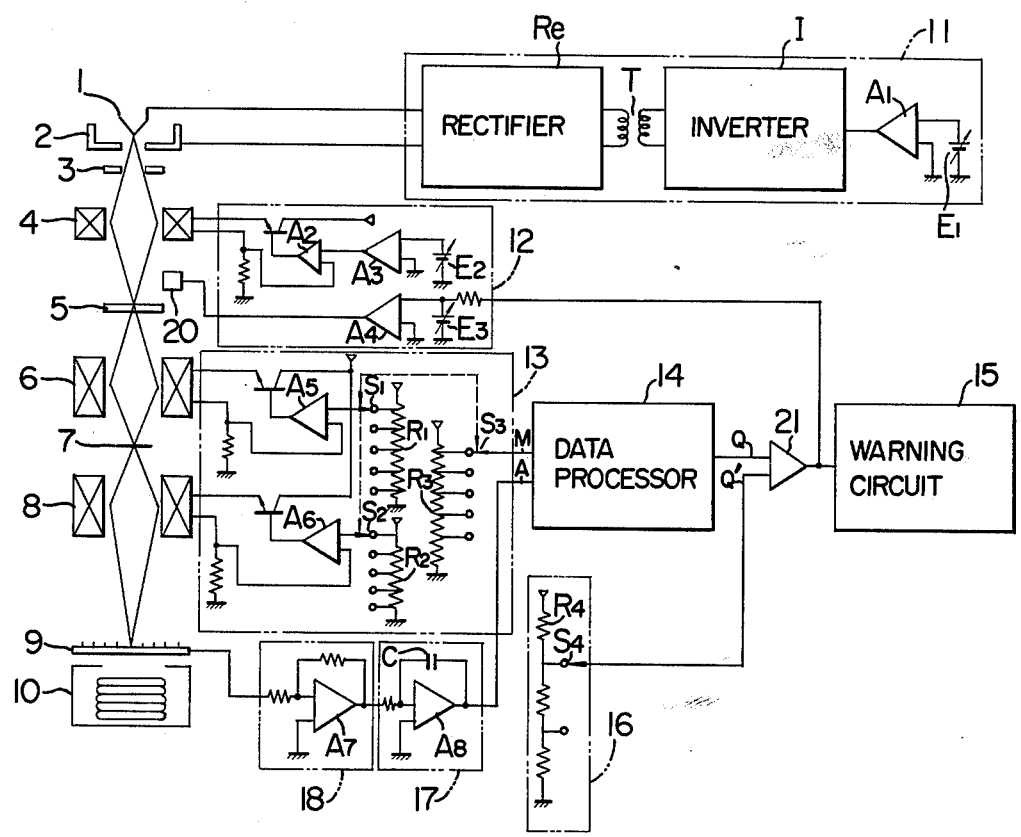
FIG. 3 schematically shows a further embodiment of the electron microscope according to the present invention.

FIG. 3 shows still another embodiment of this invention. In this embodiment, a deflection electrode 20 is provided between the sample 5 and the condenser lens 4. The deflection electrode 20 is normally not energized by a power source $E_3$ for an operational amplifier $A_4$ in the condenser lens control circuit 12. When the output signal of the comparator 21 is supplied to the operational amplifier $A_4$, the deflection electrode 20 is energized to forcibly deflect the electron beam irradiating the sample. Accordingly, by making suitable the value of the signal supplied to the deflection electrode 20, the electron beam can be entirely deviated from the sample to prevent the damage thereof.

As regards the embodiments shown in FIGS. 2 and 3, only the description has been made of those points which are different from the embodiment shown in FIG. 1 because other constitutions are substantially the same in all the embodiments of which the equivalent parts are indicated by the same reference characters.

As described above, the upper limit of the accumulation of electron beam radiation is set at a predetermined value which depends on the sample to be examined by the electron microscope, and when the limit is reached by the actual accumulated radiation, the warning circuit 15 indicates the facts, while it causes automatically the electrons emitted from the filament to decrease or cease or the electron beam density to decrease, or the electron beam to be forcibly deflected. Thus, each of the embodiments of the invention shown in FIGS. 1, 2 and 3 can attain the above objects of this invention.

It is also possible to selectively control one of the electron gun control circuit 11, the condenser lens control circuit 12 and the deflecting electrode 20 by applying the output signal of the comparator 21 i.e. the signal indicating that the above limit is reached, to the selected one of the above circuits by means of a suitable changeover switch, not shown.

Figure 4:
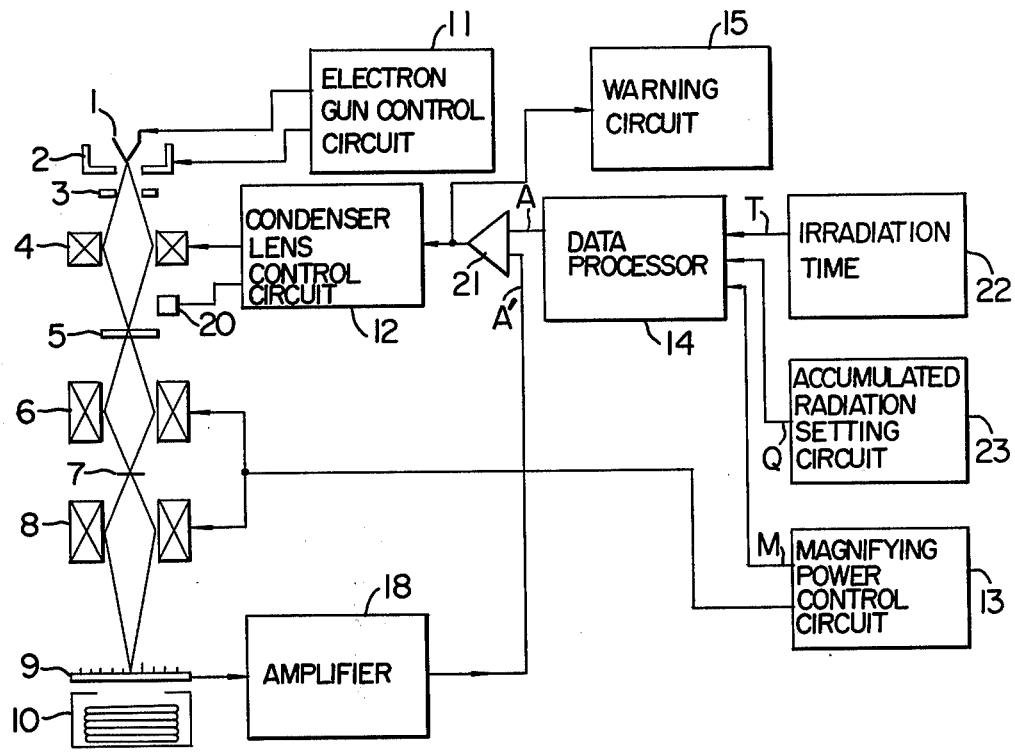
FIG. 4 schematically shows yet another embodiment of the electron microscope according to the present invention.

FIG. 4 shows a block diagram of a further embodiment of this invention. In FIG. 4, the parts equivalent to those in FIG. 1 are similarly numbered, and it will be unnecessary to describe the constitutions of the circuits thereof which are the same as those in FIG. 1. This embodiment shown in FIG. 4 is the case where the condenser lens 4 is controlled by the output signal of the comparator 21.

Now, the difference of the embodiment shown in FIG. 4 from that shown in FIG. 1 will be described. According to this embodiment, the allowable upper limit for the accumulated electron radiation to a sample to be examined and the irradiation time interval expected for the examination are preset and an allowable electron beam density obtained by calculation from the preset values for the allowable upper limit of accumulated radiation and the expected irradiation time is compared with the actually detected density of the electron beam so that when the actual density exceeds the calculated value, the condenser lens is automatically controlled to decrease the electron beam density.

Namely, the signal indicative of the density of the electron beam detected at the fluorescent plate 9 is amplified by the amplifier 18 and the output A' of the amplifier 18 is sent to one of the outputs of the comparator 21. The data processor 14 receives at its inputs the output signal M of the magnifying power control circuit 13 as well as the output signals T and Q of an irradiation time setting circuit 22 and an accumulated radiation setting circuit 23.

The data processor calculates the allowable electron beam density A from the formula (1) previously described by substituting the above values for the magnifying power, the accumulated radiation and the irradiation time therefor. The calculated beam density A is compared with the actually detected beam density A' in the comparator 21 and in accordance with the result of comparison the same control as in the embodiment shown in FIG. 2 is performed to prevent the damage of the sample.

In the embodiments shown in FIGS. 1 to 4, the fluorescent plate 9 is used as a Faraday gage and since it is removed at photographing, the electron radiation received by it during photographing is not accumulated. This may be compensated for by adding a value corresponding to the amount of electrons emitted per unit time multiplied by the time required for photographing, i.e. the total amount of electrons projected on the sample, but this compensation may be omitted because such an accumulated amount during photographic exposure is negligibly small in most cases.

In the preceding description, the examination of a constant, fixed area of the sample is mentioned, but in the actual observation the area is liable to be changed. Accordingly, the accumulated amount of electron radiation must be renewed each time the area under investigation shifts. The renewal of accumulation may be made by manually depressing a suitable reset button (not shown) or more conveniently by using a means for the fine adjustment of the area to be examined so as to automatically reset the accumulation with each change of the area.

As described above, according to the embodiments of this invention, the highest beam density allowable and the accumulated value can be automatically controlled and the examiner's attention is called by display or warning apparatus so that damage of the sample may be prevented.

The amount of electrons emitted can be directly measured by the Faraday gage as described above, but it may be indirectly measured by measuring the amount of fluorescence or X-rays emitted through the bombardment of a suitable medium by electrons. In such a case, however, the multiplication by a certain reduction factor is necessary. Either the intermediate or the final image may be used for detecting the density of the electron beam but it is preferable in view of examination to detect it at the final image. The final image of the sample is formed by electrons which have passed through the sample and therefore there is a difference between the density of the electrons emitted from the filament and the density of the detected electron beam at the final image forming position, which depends on the thickness of the sample being examined. Moreover, as described above, the allowable limit of irradiation varies depending on the sort of the sample and it is necessary to determine the limiting value to be set in the beam density setting circuit by taking the above variations into consideration.

Figure 5:
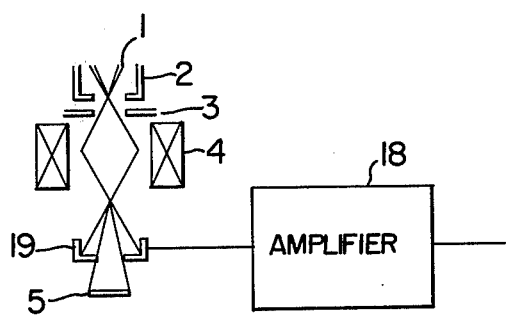
FIG. 5 schematically shows a modification of the electron detecting means shown in FIG. 1.

FIG. 5 illustrates how the Faraday gage as a detector of electron beam is arranged in an electron microscope. In this case, a Faraday cage 19 has at its central portion a perforation through which the electron beam passes, and is disposed between the condenser lens 4 and the sample 5. The Faraday cage 19 in this position has an advantage that the density of the electron beam irradiating the sample can be directly measured with high precision independent of the magnifying power, the thickness of the sample and the surface conditions of the fluorescent plate 9.

Further, the Faraday cage may be movably mounted so that it may be inserted into the beam path when the measurement of the beam density is needed, or it may be fixedly disposed in the vicinity of the beam path so that the measurement is carried out by deflecting the beam deflected for a short time by, for example, a deflection coil to project thereon. As described above, according to this invention, the sample under examination can be prevented from damage by the electron beam irradiating the sample and therefore an exact image of the sample can be obtained.

We claim:

1. An electron microscope comprising means for emitting an electron beam, means for projecting said electron beam so as to focus on a sample and transmit therethrough, means for magnifying the transmitted electron beam, means for converting the magnified electron beam into a visual image; means for setting the power of magnification by said magnifying means; means for detecting the density of the electron beam applied to said converting means; means for producing an electric signal proportional to the product of said detected density of the electron beam, the reciprocal of the square of said set value of the power of magnification, and a period of time during which said electron beam has been projected on said sample; means for producing a control signal when said electric signal reaches a predetermined value; and means responsive to said control signal to control the projection of said electron beam so as to decrease one of the density and the amount of the electron beam on said sample.

2. An electron microscope comprising means for emitting an electron beam, means for projecting said electron beam so as to focus on a sample and transmit therethrough, means for magnifying the transmitted electron beam, means for converting the magnified electron beam into a visual image; means for setting the power of magnification by said magnifying means; means for detecting the density of the electron beam applied to said converting means; means for producing an electric signal proportional to the product of said detected density of the electron beam, the reciprocal of the square of said set value of the power of magnification, and a period of time during which said electron beam has been projected on said sample; means for producing a control signal when said electric signal reaches a predetermined value; and means for feeding back said control signal to said electron beam emitting means thereby to decrease the amount of the electron beam on said sample.

3. An electron microscope comprising means for emitting an electron beam, means for projecting said electron beam so as to focus on a sample and transmit therethrough, means for magnifying the transmitted electron beam, means for converting the magnified electron beam into a visual image; means for setting the power of magnification by said magnifying means; means for detecting the density of the electron beam applied to said converting means; means for producing an electric signal proportional to the product of said detected density of the electron beam, the reciprocal of the square of said set value of the power of magnification, and a period of time during which said electron beam has been projected on said sample; means for producing a control signal when said electric signal reaches a predetermined value; and means for feeding back said control signal to said electron beam projecting means thereby to decrease the density of the electron beam on said sample.

4. An electron microscope comprising means for emitting an electron beam, means for projecting said electron beam so as to focus on a sample and transmit therethrough, means for magnifying the transmitted electron beam, means for converting the magnified electron beam into a visual image; means for setting the power of magnification by said magnifying means; means for detecting the density of the electron beam applied to said converting means; means for producing an electric signal proportional to the product of said detected density of the electron beam, the reciprocal of the square of said set value of the power of magnification, and a period of time during which said electron beam has been projected on said sample; means for producing a control signal when said electric signal reaches a predetermined value; and mean responsive to said control signal to interrupt the projection of the electron beam on said sample.

5. An electron microscope according to claim 4, wherein said interrupting means includes means for deflecting said emitted electron beam outside said sample.

* * * * *